United States Patent
Kim (10) Patent No.: US 8,878,289 B2
(45) Date of Patent: Nov. 4, 2014

(54) SEMICONDUCTOR DEVICE AND METHOD FOR MANUFACTURING THE SAME

(71) Applicant: SK hynix Inc., Icheon (KR)

(72) Inventor: Kyung Do Kim, Seoul (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 13/708,905

(22) Filed: Dec. 7, 2012

(65) Prior Publication Data

US 2013/0146968 A1 Jun. 13, 2013

(30) Foreign Application Priority Data

Dec. 8, 2011 (KR) ........................ 10-2011-0130830

(51) Int. Cl.
- *H01L 29/66* (2006.01)
- *H01L 27/108* (2006.01)
- *H01L 29/78* (2006.01)
- *H01L 21/762* (2006.01)

(52) U.S. Cl.
CPC ...... *H01L 29/7827* (2013.01); *H01L 27/10823* (2013.01); *H01L 27/10876* (2013.01); *H01L 29/66666* (2013.01); *H01L 21/762* (2013.01); *H01L 27/10891* (2013.01)

USPC ........... 257/330; 438/270; 438/430; 257/520; 257/E21.59

(58) Field of Classification Search
CPC ..................... H01L 29/7827; H01L 29/66666; H01L 29/4236; H01L 29/42356
USPC ........................................... 257/330; 438/270
See application file for complete search history.

(56) References Cited

U.S. PATENT DOCUMENTS

| | | | |
|---|---|---|---|
| 7,462,908 B2 * | 12/2008 | Bol et al. | 257/328 |
| 8,304,824 B2 * | 11/2012 | Kim et al. | 257/302 |
| 2010/0193901 A1 * | 8/2010 | Jang et al. | 257/520 |

FOREIGN PATENT DOCUMENTS

| | | |
|---|---|---|
| KR | 10-0855967 B1 | 9/2008 |
| KR | 10-2012-0126721 A | 11/2012 |

* cited by examiner

*Primary Examiner* — Reema Patel
*Assistant Examiner* — Syed Gheyas (57) ABSTRACT

In the semiconductor device, a line-type buried gate is formed by burying a non-operating gate (isolation gate) with a polysilicon material to reduce a work function and a Gate Induced Drain Leakage (GIDL) caused by the non-operating gate, resulting in improvement of refresh characteristics of the semiconductor device. Operating gates including a metal conductive material may be formed in a separate step.

6 Claims, 10 Drawing Sheets

Cell Array

SEMICONDUCTOR DEVICE AND METHOD FOR MANUFACTURING THE SAME

CROSS-REFERENCE TO RELATED APPLICATION

The priority of Korean patent application No. 10-2011-0130830 filed on 8 Dec. 2011, the disclosure of which is hereby incorporated in its entirety by reference, is claimed.

BACKGROUND OF THE INVENTION

Embodiments of the present invention relate to a semiconductor device and a method for manufacturing the same in which a line-type buried gate is formed by burying a non-operating gate (isolation gate) with a polysilicon material.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs using a semiconductor property wherein an electrical conductivity changes depending on conditions. The transistor has three regions: a gate, a source, and a drain. Electric charges are moved between the source and the drain according to a control signal inputted to the gate of the transistor. The movement of the electric charges between the source and the drain is achieved through a channel region.

Where a general transistor is formed on a semiconductor substrate, a conventional method of forming a gate on the semiconductor substrate includes doping impurities into both sides of the gate to form a source and a drain. As the data storage capacity of semiconductor memory devices increases and the size of features decreases, the size of each unit cell also decreases. That is, a design rule of the capacitor and the transistor included in the unit cell has been reduced. Thus, while the channel length of a cell transistor is gradually decreased, the short channel effect, Drain Induced Barrier Lower (DIBL), etc., occur in a general transistor and thus operational reliability is decreased. By maintaining a threshold voltage such that the cell transistor performs a normal operation, it is possible to solve some of the problems caused by decreased channel length. In general, as the channel of the transistor shortens, the concentration of the impurities doped into a region in which the channel is formed has been increased.

However, if the concentration of the impurities doped into the channel region is increased while the design rule is reduced to 100 nm or less, the electric field of a Storage Node (SN) junction is increased, thereby lowering the refresh characteristics of a semiconductor memory device. In order to solve this problem, a cell transistor having a three-dimensional channel structure in which a channel extends in a vertical direction is used such that the channel length of the cell transistor is maintained even when the design rule is decreased. That is, even when a channel width in a horizontal direction is short, since the channel length of the vertical direction is secured, impurity doping concentration may be reduced and thus, refresh characteristics are maintained.

In addition, as the degree of integration of semiconductor devices is increased, the distance between a word line coupled to a cell transistor and a bit line coupled to the cell transistor is gradually reduced. As a result, there may arise shortcomings in which parasitic capacitance is increased such that an operating margin of a sense amplifier (sense-amp) that amplifies data transmitted via the bit line is deteriorated, resulting in a negative influence upon operation of the semiconductor device. In order to solve the above-mentioned shortcomings while simultaneously reducing parasitic capacitance between a bit line and a word line, a buried word line structure in which a word line is formed only in a recess instead of an upper part of the semiconductor substrate has been proposed. The buried word line structure includes a conductive material in a recess formed in a semiconductor substrate, and an insulation film covering an upper part of the conductive material such that the word line is buried in a semiconductor substrate. As a result, the buried word line structure can be electrically isolated from a bit line formed over a semiconductor substrate including source/drain regions.

However, the buried word line (buried gate) structure has some disadvantages. First, GIDL characteristics of a semiconductor device are deteriorated between a conductive material (gate electrode) and an N-type junction of an active region. Second, refresh characteristics of the whole semiconductor device are deteriorated due to the deteriorated GIDL characteristics.

BRIEF SUMMARY OF THE INVENTION

Various embodiments of the present invention are directed to providing a semiconductor device and a method for manufacturing the same that substantially obviate one or more problems due to limitations and disadvantages of the related art, including those discussed herein.

An embodiment of the present invention relates to a semiconductor device and a method for manufacturing the same in which a line-type buried gate is formed by burying a non-operating gate (isolation gate) with a polysilicon material to reduce a work function and a Gate Induced Drain Leakage (GIDL) caused by the non-operating gate, resulting in improvement of refresh characteristics of the semiconductor device.

In accordance with one aspect of the present invention, a method for manufacturing a semiconductor device includes forming a non-operating gate in a semiconductor substrate; forming a first hard mask layer over the semiconductor substrate and the non-operating gate; forming a trench by etching the first hard mask layer; burying an insulation film in the trench; after etching a center part of the insulation film contained in the trench, burying a second hard mask layer in the etched region; removing the remaining insulation film; forming an operation gate region by etching the semiconductor substrate using the second and first hard mask layers as an etch mask; and forming an operation gate in the operation gate region.

The forming of the non-operating gate may include sequentially forming a hard mask oxide film and a hard mask carbon film over the semiconductor substrate; forming a non-operating gate region by etching the hard mask carbon film and the hard mask oxide film; forming a gate oxide film in the non-operating gate region; forming a gate polysilicon layer over the gate oxide film; etching back the gate polysilicon layer; and forming a nitride film over the etched-back gate polysilicon layer.

The forming of the non-operating gate region may include forming the non-operating gate region by anisotropically etching the hard mask carbon film and the hard mask oxide film.

The forming of the first hard mask layer may include forming a hard mask oxide film not only over the semiconductor substrate but also over the non-operating gate; and forming a hard mask polysilicon film over the hard mask oxide film.

The forming of the trench may include anisotropically etching a first hard mask layer formed over semiconductor substrate disposed between the non-operating gates.

The insulation film may include an oxide film.

The second hard mask layer may include a polysilicon film.

The forming of the operation gate region may include anisotropically etching the semiconductor substrate.

The forming of the operation gate in the operation gate region may include forming a gate oxide film in the operation gate region; forming a gate electrode layer over the gate oxide film; etching back the gate electrode layer; and forming a nitride film over the etched-back gate electrode layer.

The non-operating gate and the operation gate may be formed as a line type.

The method may further include after forming the operation gate, forming a source/drain region by implanting N-type impurity ions in the semiconductor substrate.

In accordance with another aspect of the present invention, a semiconductor device includes an operation gate comprising a laminate structure of a gate oxide film, a gate metal layer, and a nitride film and a non-operating gate comprising a laminate structure of a gate oxide film, a gate polysilicon layer, and a nitride film formed in a semiconductor substrate.

The non-operating gate and the operation gate may be formed as a line type.

The semiconductor device may further include a source/drain region disposed between the operation gates.

It is to be understood that both the foregoing general description and the following detailed description of the present invention are only exemplary and are intended to provide further explanation of the invention as claimed, but are not limited to the described embodiments.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
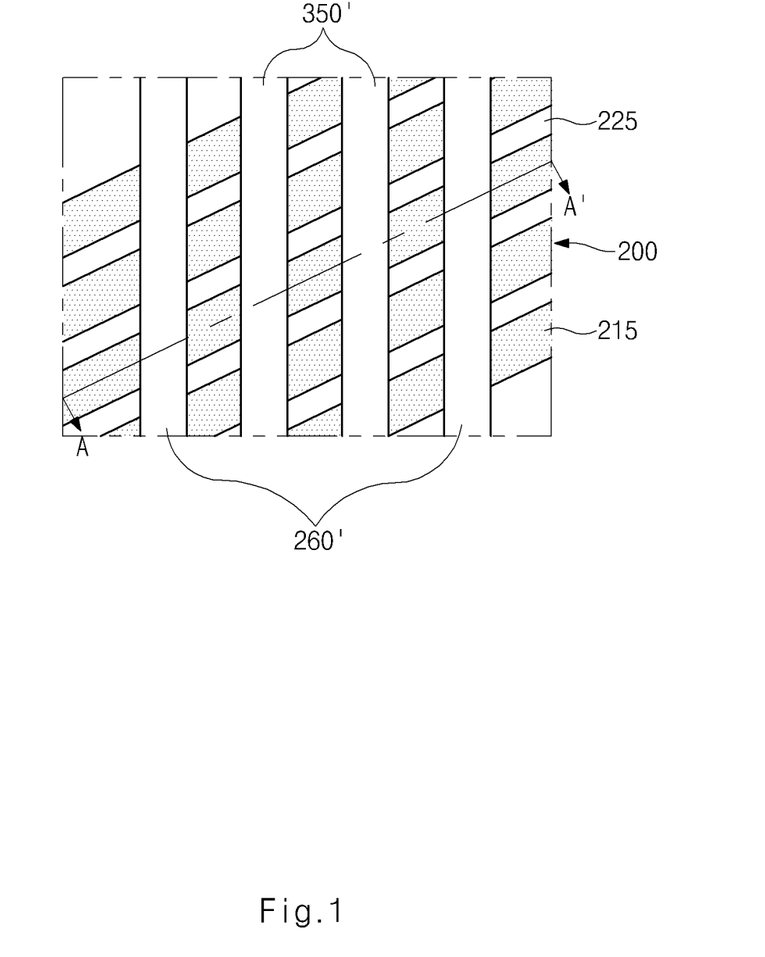
FIG. 1 is a plan view illustrating a semiconductor device and a method for manufacturing the same according to an embodiment of the present invention.

FIG. 1 is a plan view illustrating a semiconductor device and a method for manufacturing the same according to an embodiment of the present invention.

Referring to FIG. 1, a device isolation region 225 defining an active region 215, and buried gates 260' and 350' crossing the active region 215 are formed over a semiconductor substrate 200. In an embodiment, the active region 215 is formed as an island type, and each buried gate 260' or 350' includes an operating gate 350' and a non-operating gate 260' and is formed as a line type.

The device isolation region 225 for defining an active region 215 is formed as described below.

A pad insulation film (not shown) comprising a pad oxide film and a pad nitride film is deposited over the semiconductor substrate 200. Thereafter, a photoresist film (not shown) is deposited, and an exposure process is carried out using a mask configured to define the active region 215. Subsequently, a Spin On Dielectric (SOD) material is buried in a trench (not shown) formed by etching the exposed pad insulation film and the semiconductor substrate 200, and is then processed by Chemical Mechanical Polishing (CMP) until the pad insulation film is exposed, thereby creating the device isolation region 225.

FIGS. 2A to 2H are cross-sectional views illustrating a semiconductor device and a method for manufacturing the same according to an embodiment of the present invention. In more detail, FIGS. 2A to 2H are cross-sectional views illustrating the semiconductor device taken along the line A-A' of FIG. 1.

Figure 2A:
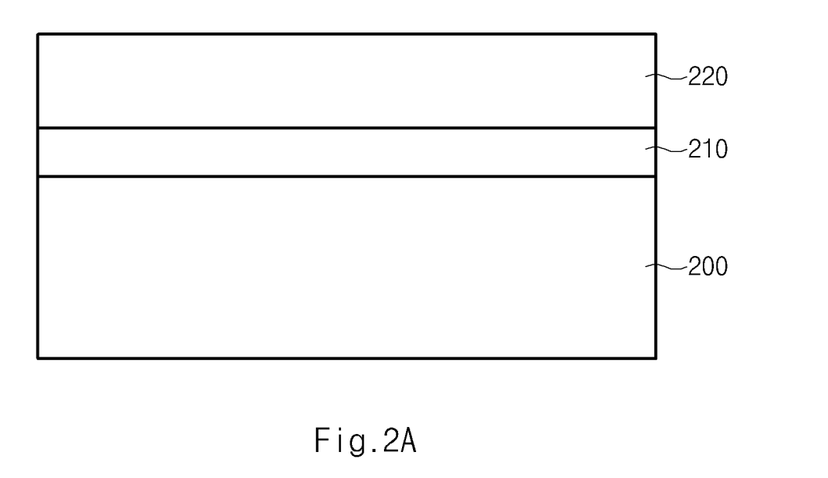
FIGS. 2A to 2H are cross-sectional views illustrating a semiconductor device and a method for manufacturing the same according to an embodiment of the present invention.

Referring to FIG. 2A, a hard mask oxide film 210 and a hard mask carbon film 220 are sequentially formed over the semiconductor substrate 200.

Figure 2B:
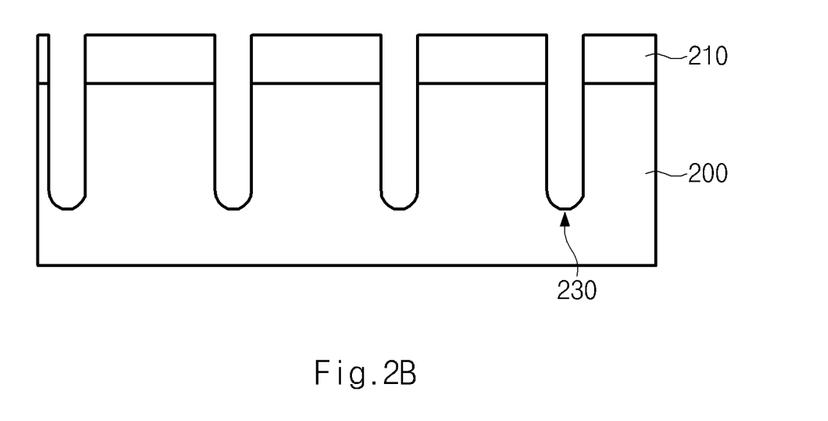

Referring to FIG. 2B, after a photoresist film is formed over the hard mask carbon film 220, a photoresist pattern (not shown) is formed by an exposure and development process using a non-operating gate mask (or an isolation gate mask). Thereafter, the hard mask carbon film 220 is etched using the photoresist pattern as an etch mask so that a hard mask carbon film pattern (not shown) is formed. Subsequently, the hard mask oxide film 210 and the semiconductor substrate 200 are etched using the hard mask carbon film pattern as an etch mask, so that a first trench 230 is formed. In an embodiment, the etching process for forming the first trench 230 is an anisotropic etching process.

Figure 2C:
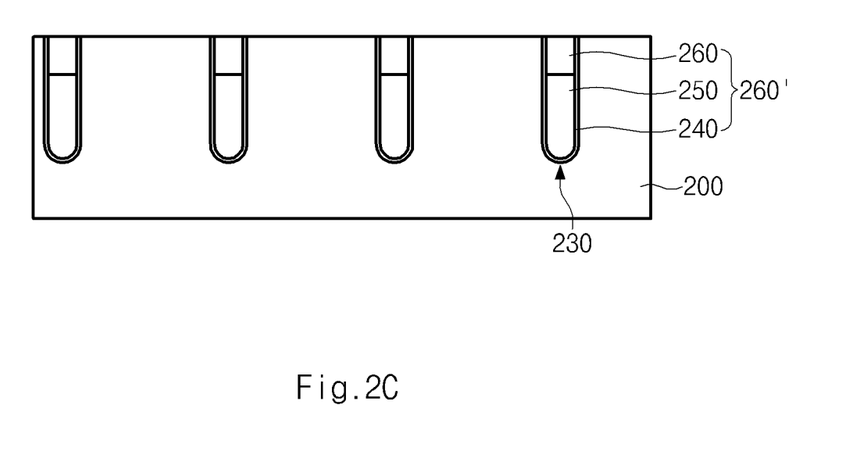

Referring to FIG. 2C, a gate oxide film 240 is formed in the first trench 230, a polysilicon film 250 is formed over the gate oxide film 240, and the gate polysilicon film 250 is then etched back. In embodiments, the gate oxide film 240 may be formed by deposition of an oxide film or an oxidation process.

Then, a nitride film 260 is formed over the etched-back gate polysilicon film 250 and the semiconductor substrate 200. The nitride film 260 is then CMP-etched (or planarized) until the semiconductor substrate 200 is exposed, so that a non-operating 260' (i.e., an isolation gate) is formed. Both the nitride film 260 and the non-operating gate 260' may be formed as line type structures. In an embodiment, no voltage is applied to non-operating gate 260'. A non-operating gate may also be referred to as a dummy gate.

Figure 2D:
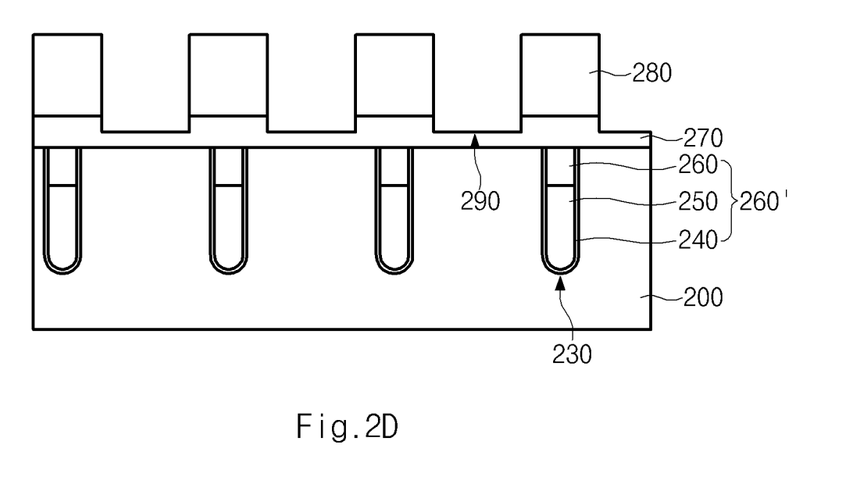

Referring to FIG. 2D, a hard mask oxide film 270 and a hard mask polysilicon film 280 are formed over the semiconductor substrate 200 and the non-operating gate 260'.

After forming a photoresist film (not shown) over the hard mask polysilicon film 280, a photoresist pattern (not shown) is formed by an exposure and development process using a mask defining an region in which an operational gate will be subsequently formed. The hard mask polysilicon film 280 and the hard mask oxide film 270 are etched using the photoresist pattern as an etch mask, so that a second trench 290 is formed. The etching process for forming the second trench 290 may be an anisotropic etching process.

Figure 2E:
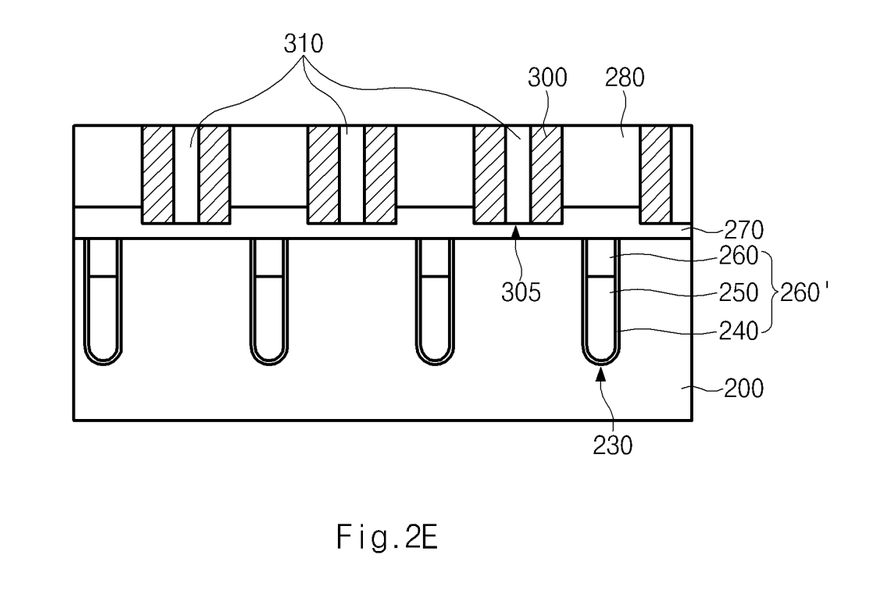

Referring to FIG. 2E, an insulation film 300 is buried in the second trench 290. Preferably, the insulation film 300 may include an oxide film.

After forming a photoresist film (not shown) over the insulation film 300 and the hard mask polysilicon film 280, a photoresist pattern (not shown) is formed by an exposure and development process using a mask configured to expose only a center part of the insulation film 300. The insulation film 300 is etched using the photoresist pattern as an etch mask so that a hole 305 is formed.

Subsequently, a hard mask polysilicon film 310 is buried in the hole 305.

Figure 2F:
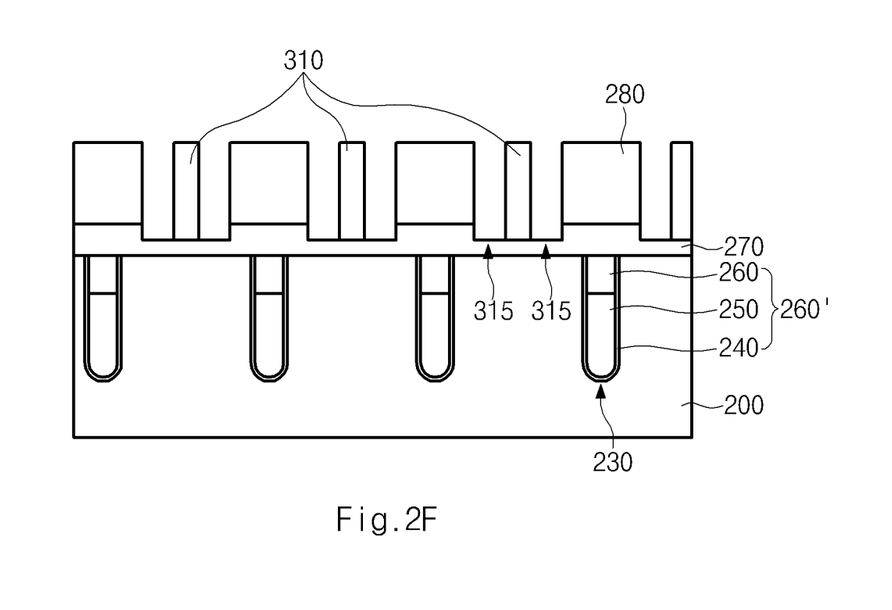

Referring to FIG. 2F, the insulation film 300 disposed on both sides of the hard mask polysilicon film 310 is removed so that third trenches 315 are formed.

Figure 2G:
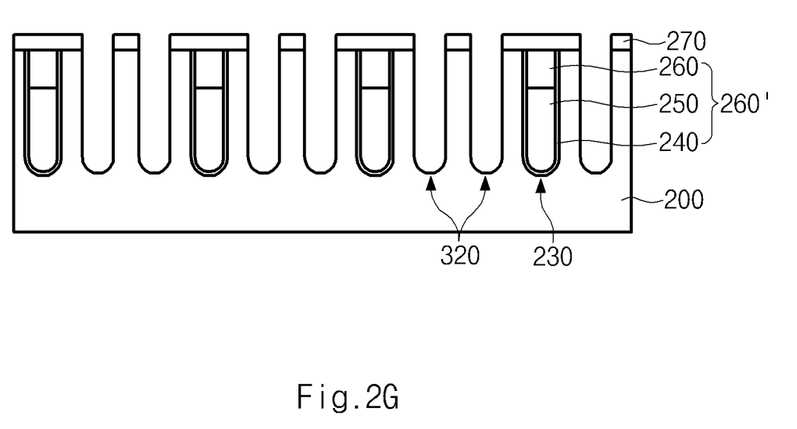

Referring to FIG. 2G, the hard mask oxide film 270 and the semiconductor substrate 200 are etched using the hard mask polysilicon films 310 and 280 as an etch mask, so that a trench is formed in operating gate region 320.

Figure 2H:
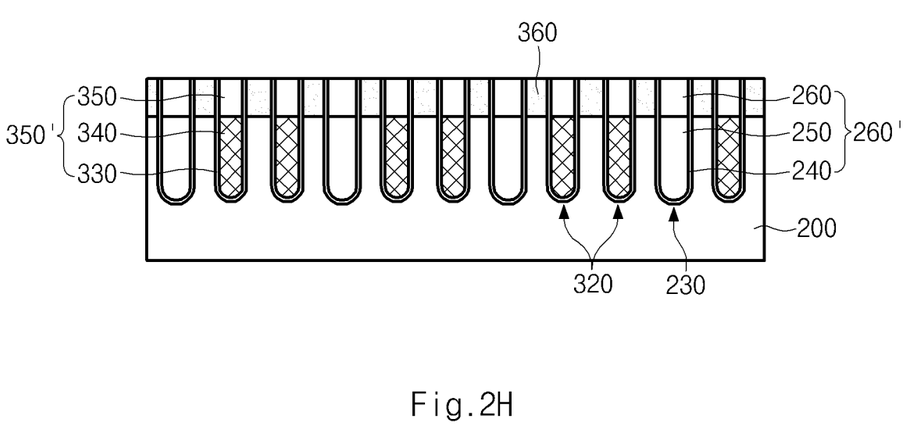

Referring to FIG. 2H, after a gate oxide film 330 and a gate electrode material 340 are formed in the operating gate region 320, the gate electrode material 340 is etched back. In embodiments, the gate oxide film 330 may be formed either by deposition of an oxide film or by an oxidation process. In addition, the gate electrode material 340 may include aluminium (Al), tungsten (W), tungsten nitride (WN), titanium (Ti), titanium nitride (TiN), or titanium nitride/tungsten (TiN/W).

After forming a nitride film 350 not only over the etched-back gate electrode material 340 but also over the semiconductor substrate 200, the nitride film 350 is planarized-etched until the semiconductor substrate 200 is exposed, so that an operating gate 350' is formed. Next, exposed portions of semiconductor substrate 200 may be etched back, and a conductive material may be deposited to form a junction region 360 between neighboring gates. In an embodiment, junction region 360 may include a conductive material such as a metal or doped polysilicon. The resulting structure may include a plurality of non-operating gates 260' comprising a conductive polysilicon material, and a plurality of operating gates 350' comprising a conductive metal material.

Figure 3:
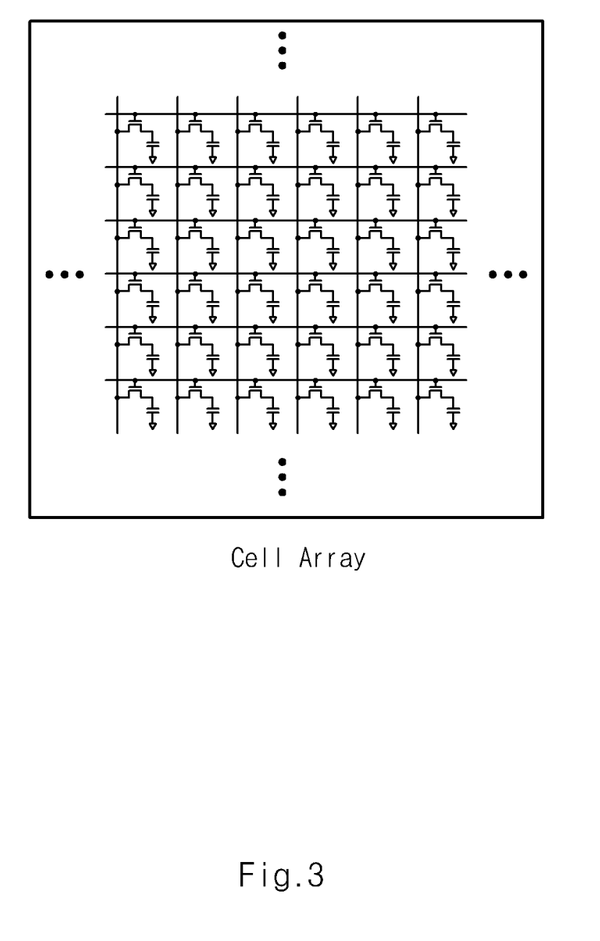
FIG. 3 is a block diagram illustrating a cell array according to the present invention.

FIG. 3 illustrates a cell array according to the present invention.

Referring to FIG. 3, the cell array includes a plurality of memory cells, and each memory cell includes one transistor and one capacitor. Such memory cells are located at intersection points of bit lines BL1~BLn and word lines WL1~WLm. The memory cells may store or output data in response to a voltage applied to any bit line (BL1, . . . , BLn) and any word line (WL1, . . . , WLm) selected by a column decoder and a row decoder.

As can be seen from FIG. 3, bit lines (BL1, . . . , BLn) in a first direction (bit-line direction) are formed in the longitudinal direction, and word lines (WL1, . . . , WLm) in a second direction (word-line direction) are formed in the latitudinal direction, such that the bit lines (BL1, . . . , BLn) are crossed with the word lines (WL1, . . . , WLm). A first terminal (for example, a drain terminal) of each transistor is coupled to one of the bit lines (BL1, . . . , BLn), a second terminal (for example, a source terminal) of each transistor is coupled to a capacitor, and a third terminal (for example, a gate terminal) of each transistor is coupled to one of the word lines (WL1, . . . , WLm). A plurality of memory cells including the bit lines (BL1, . . . , BLn) and the word lines (WL1, . . . , WLm) are thus formed in a semiconductor cell array.

Figure 4:
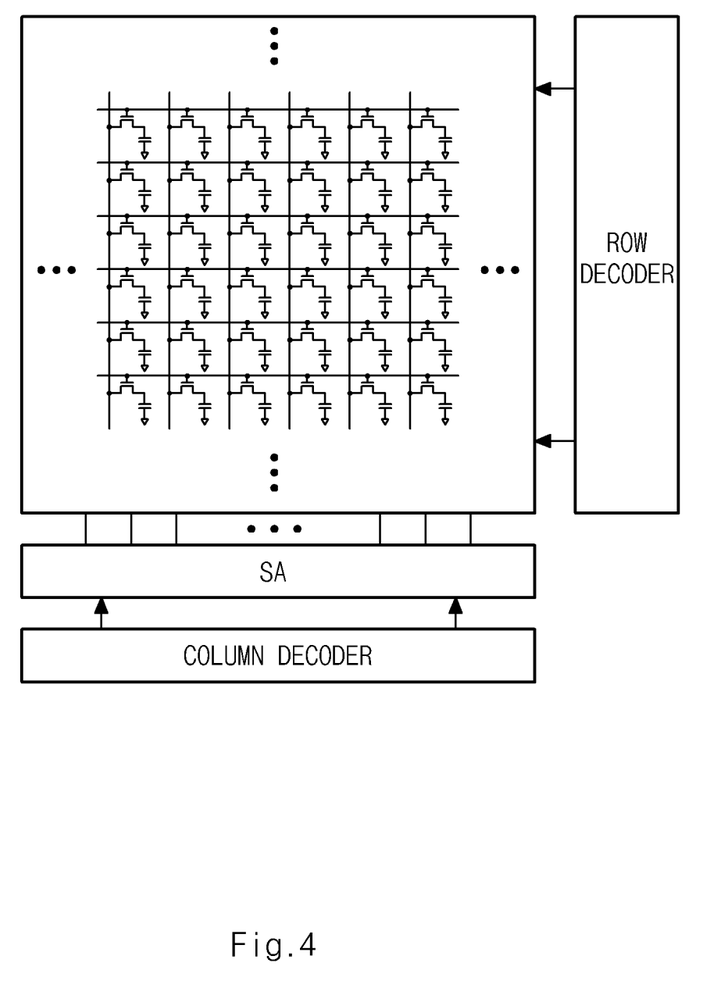
FIG. 4 is a block diagram illustrating a semiconductor device according to the present invention.

FIG. 4 is a block diagram illustrating a semiconductor device according to the present invention.

Referring to FIG. 4, the semiconductor device may include a cell array, a row decoder, a column decoder, and a sense amplifier (SA). The row decoder selects a word line corresponding to a memory cell, in which a read or write operation is to be performed, from among a plurality of word lines of the semiconductor cell array. The row decoder further outputs a word line selection signal (RS) to the semiconductor cell array. In addition, the column decoder selects a bit line corresponding to a memory cell, in which a read or write operation is to be performed, from among a plurality of bit lines of the semiconductor cell array. The column decoder outputs a bit line selection signal (CS) to the semiconductor cell array. In addition, the sense-amplifier (SA) senses data (BDS) stored in a memory cell selected by the row decoder and column decoder.

Furthermore, the semiconductor device may be coupled to a microprocessor or a memory controller. The semiconductor device may receive control signals such as WE* (write enable signal), RAS* (row address strobe signal), and CAS* (column address strobe signal) from the microprocessor, receive data through an input/output (I/O) circuit, and store the received data. The semiconductor device may be applied to a Dynamic Random Access Memory (DRAM), a P-Random Access Memory (P-RAM), an M-Random Access Memory (M-RAM), a NAND flash memory, and a CMOS Image Sensor (CIS), and the like. Specifically, the semiconductor device may be applicable to a desktop computer, a laptop computer, or a server, and may also be applicable to a graphic memory and a mobile memory. The NAND flash memory may be applicable not only to a variety of portable storage media (for example, a memory stick, a multimedia card (MMC), a secure digital (SD) card, a compact flash (CF) card, an extreme Digital (XD) picture card, a universal serial bus (USB) flash drive, etc.), but also to a variety of digital applications (for example, MP3, PMP, digital camera, camcorder, memory card, USB, game machine, navigation, laptop computer, desktop computer, mobile phone, and the like). The CMOS Image Sensor (CIS) is a charge coupled device (CCD) serving as an electronic film in digital devices, and is applicable to a camera phone, a Web camera, a small-sized medical imaging devices, etc.

Figure 5:
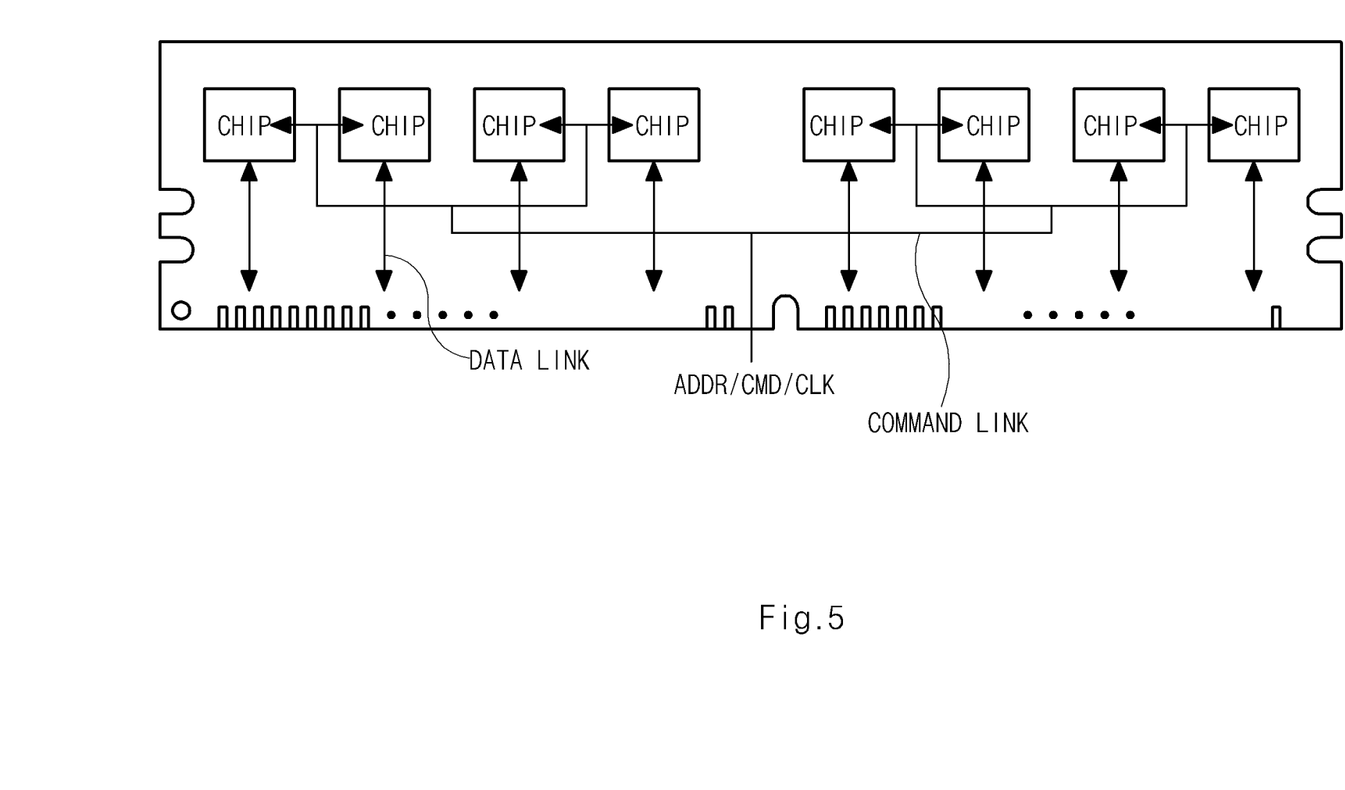
FIG. 5 is a block diagram illustrating a semiconductor module according to the present invention.

FIG. 5 is a block diagram illustrating a semiconductor module according to the present invention.

Referring to FIG. 5, a semiconductor module includes a plurality of semiconductor devices mounted to a module substrate, a command link, and a data link. The command link enables each semiconductor device to receive a control signal (address signal (ADDR)), a command signal (CMD), and a clock signal (CLK) from an external controller (not shown). The data link is coupled to each semiconductor device to transmit and receive data to and from each semiconductor device.

In one embodiment, the semiconductor device may correspond to the semiconductor devices disclosed in FIG. 5. In addition, the command link and the data link may be formed to be identical or similar to those of general semiconductor modules.

Although eight semiconductor chips are mounted to the front surface of the module substrate as shown in FIG. 5, it should be noted that one or more of the semiconductor chips may also be mounted to the back surface of the module substrate. That is, the semiconductor chips may be mounted to one side or both sides of the module substrate, and the number of mounted semiconductor chips is not limited only to the example of FIG. 5. In addition, the material and structure of the module substrate are not limited to those of FIG. 5, and the module substrate may also be formed of other materials or structures.

Figure 6:
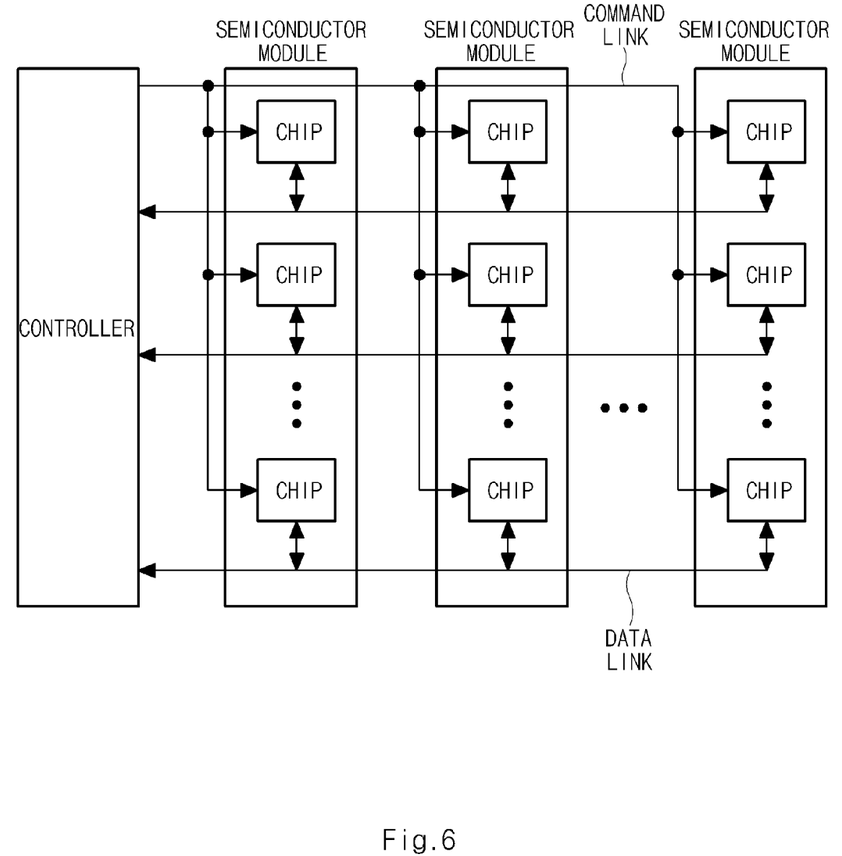
FIG. 6 is a block diagram illustrating a semiconductor system according to the present invention.

FIG. 6 is a block diagram illustrating a semiconductor system according to the present invention.

Referring to FIG. 6, a semiconductor system includes at least one semiconductor module, including a plurality of semiconductor chips, and a controller for providing a bidirectional interface between each semiconductor module and an external system (not shown) to control the operations of the semiconductor modules. The controller may be identical or similar in function to a controller for controlling a plurality of semiconductor modules for use in a general data processing system, and as such a detailed description thereof will herein be omitted for convenience of description. In one embodiment, the semiconductor module may be, for example, a semiconductor module shown in FIG. 5.

Figure 7:
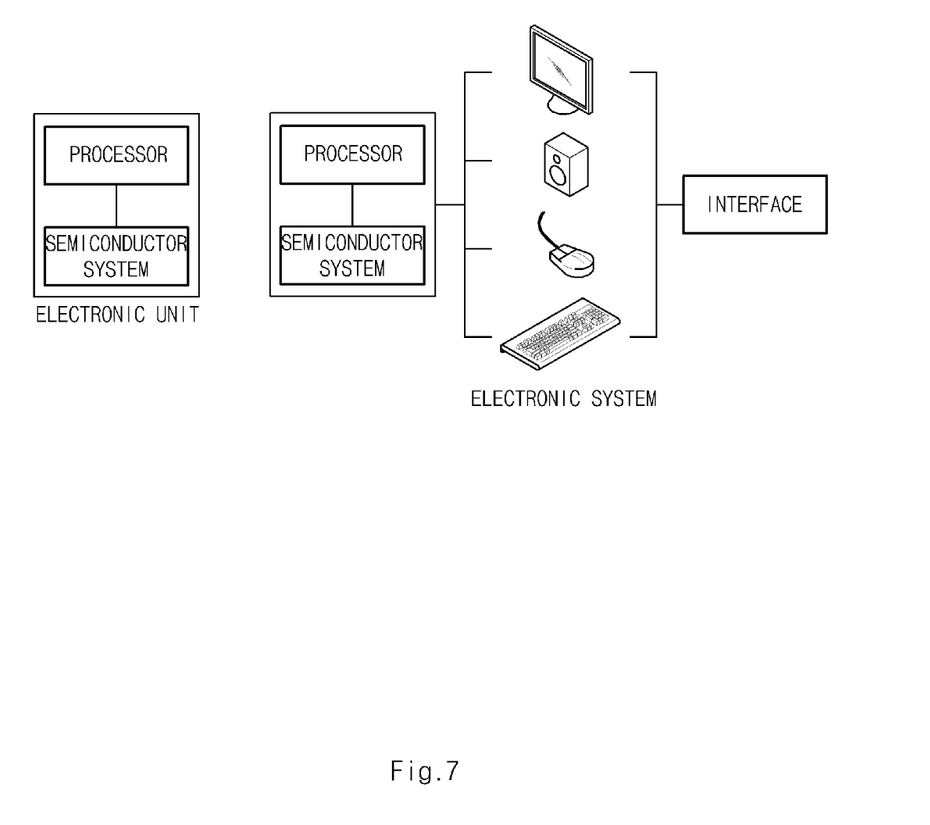
FIG. 7 is a block diagram illustrating an electronic unit and an electronic system according to embodiments of the present invention.

FIG. 7 is a block diagram illustrating an electronic unit and an electronic system according to embodiments of the present invention.

Referring to the left side of FIG. 7, the electronic unit according to the present invention includes an electronic unit and a processor electrically coupled to the electronic unit. In one embodiment, the semiconductor system of FIG. 6 is identical to that of FIG. 7. In one embodiment, the processor may include a Central Processing Unit (CPU), a Micro Processor Unit (MPU), a Micro Controller Unit (MCU), a Graphics Processing Unit (GPU), a Digital Signal Processor (DSP), or a combination thereof.

In one embodiment, the CPU or MPU is configured in the form of a combination of an Arithmetic Logic Unit (ALU) serving as arithmetic and logical operation unit and a Control Unit (CU) for controlling each unit by reading and interpreting a command. Preferably, when the processor is a CPU or MPU, the electronic unit may include a computer device or a mobile device. In addition, the GPU, serving as a CPU for graphics, is used to calculate numbers having decimal points, and corresponds to a process for drawing graphic data as a real-time image. Preferably, when the processor is a GPU, the electronic unit may include a graphic device. In addition, a DSP is a processor that converts an analog signal (e.g., voice signal) into a digital signal at high speed, uses the calculated result, re-converts the digital signal into the analog signal, and uses the re-converted result. The DSP mainly calculates a digital value. When the processor is a DSP, the electronic unit may preferably include a sound and imaging device.

The processor may include an Accelerate Processor Unit (ACU), and may be configured in the form of a CPU integrated into the GPU to serve as a graphic card.

Referring to the right side of FIG. 7, the electronic system may include one or more interfaces electrically coupled to the electronic unit. In one embodiment, the electronic unit is identical to that of FIG. 7. In one embodiment, the interface may include a monitor, a keyboard, a printer, a pointing device (mouse), a USB, a switch, a card reader, a keypad, a dispenser, a phone, a display, or speaker. However, it should be noted that the scope of the interface is not limited thereto and is also applicable to other examples.

As is apparent from the above description, a method for forming the semiconductor device according to the embodiments of the present invention has a number of advantages. In the semiconductor device, a void is formed between metal lines of a peripheral region to minimize parasitic capacitive coupling between the metal lines, resulting in improvement of the operation characteristics of the semiconductor device, for example, a sense amplifier, a sub word line, etc., having a highly-integrated peripheral region.

As is apparent from the above description, according to the semiconductor device and a method for manufacturing the same, a line-type buried gate is formed by burying a non-operating gate (isolation gate) with a polysilicon material to reduce a work function. In addition, a Gate Induced Drain Leakage (GIDL) caused by the non-operating gate is reduced, resulting in improvement of refresh characteristics of the semiconductor device.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device formed in a semiconductor substrate comprising:
    an operating gate including a laminate structure of a gate oxide film, a gate metal layer, and a nitride film; and
    a non-operating gate including a laminate structure of a gate oxide film, a gate polysilicon layer, and a nitride film,
    wherein no voltage is applied to the non-operating gate.

2. The semiconductor device according to claim 1, wherein the non-operating gate and the operating gate are line type structures.

3. The semiconductor device according to claim 1, further comprising a source/drain region disposed between the operating gates.

4. The semiconductor device according to claim 3, wherein the source/drain region comprises N-type impurity ions implanted in the semiconductor substrate.

5. The semiconductor device according to claim 1, further comprising:
    a plurality of the operating gates arranged in adjacent pairs; and
    a plurality of the non-operating gates,
    wherein each adjacent pair of operating gates has a first non-operating gate of the plurality of non-operating gates on a first side of the adjacent pair, and a second non-operating gate of the plurality of non-operating gates on a second side of the adjacent pair.

6. The semiconductor device according to claim 1 further comprising:
    pairs of the operating gates and a plurality of the non-operating gates,
    wherein non-operating gates of the plurality of non-operating gates are disposed on opposing sides of each of the pairs of operating gates.

* * * * *